United States Patent [19]
Lake

[11] Patent Number: 6,030,423
[45] Date of Patent: Feb. 29, 2000

[54] THIN PROFILE BATTERY BONDING METHOD AND METHOD OF CONDUCTIVELY INTERCONNECTING ELECTRONIC COMPONENTS

[75] Inventor: Rickie C. Lake, Eagle, Id.

[73] Assignee: Micron Technology, Inc., Boise, Id.

[21] Appl. No.: 09/022,812

[22] Filed: Feb. 12, 1998

[51] Int. Cl.[7] ............................. H01M 6/00; H01M 6/46
[52] U.S. Cl. ......................... 29/623.4; 429/152; 429/157
[58] Field of Search .......................... 29/623.4; 429/156, 429/157, 186, 152

[56] References Cited

U.S. PATENT DOCUMENTS

| | | | |
|---|---|---|---|
| 4,051,161 | 9/1977 | Proskow | 260/448.8 R |
| 4,208,005 | 6/1980 | Nate et al. | 228/175 |
| 4,470,883 | 9/1984 | Eichelberger et al. | 204/15 |
| 5,558,679 | 9/1996 | Tuttle | 29/623.1 |
| 5,601,941 | 2/1997 | Tuttle | 429/121 |

OTHER PUBLICATIONS

Miszczyk et al. Laboratory evaluation of epoxy coatings with an adhesion promoter by impedance. Progress in Organic Coatings 25 (1995) 357–363, 1995.

Gu et al. Effect of deposition conditions for g–aminopropyltriethoxy silane on adhesion between copper and epoxy resins. Applied Surface Science 115 (1997) 66–73, 1997.

Lin et al. Synthesis of novel trifunctional epoxy resins and their modification with polydimethylsiloxane for electronic application. Elsevier Science Ltd. PH: s0032–3861 (96)00713–6, 1996.

Product Information Brochure, "Information About Organofunctional Silane Chemicals", Dow Corning Corporation (date unknown) no year or month available.

Product Information Brochure, "Information About Dow Corning® Z–6040 Silane", Dow Corning Corporation (1996) no month available.

Primary Examiner—Maria Nuzzolillo
Assistant Examiner—Tracy Dove
Attorney, Agent, or Firm—Wells, St. John, Roberts, Gregory & Matkin, P.S.

[57] ABSTRACT

A curable adhesive composition is provided which comprises an epoxy terminated silane. A thin profile battery and a substrate to which the thin profile battery is to be conductively connected are also provided. The curable adhesive composition is interposed between the thin profile battery and the substrate. It is cured into an electrically conductive bond electrically interconnecting the battery and the substrate. In another aspect, the invention includes a method of conductively interconnecting electronic components using a curable adhesive composition which comprises an epoxy terminated silane. The invention in another aspect includes interposing a curable epoxy composition between first and second electrically conductive components to be electrically interconnected. At least one of the components comprises a metal surface with which the curable epoxy is to electrically connect. The epoxy is cured into an electrically conductive bond electrically interconnecting the first and second components. The epoxy has an effective metal surface wetting concentration of silane to form a cured electrical interconnection having a resistance through said metal surface of less than or equal to about 0.3 ohm-cm$^2$.

16 Claims, 2 Drawing Sheets

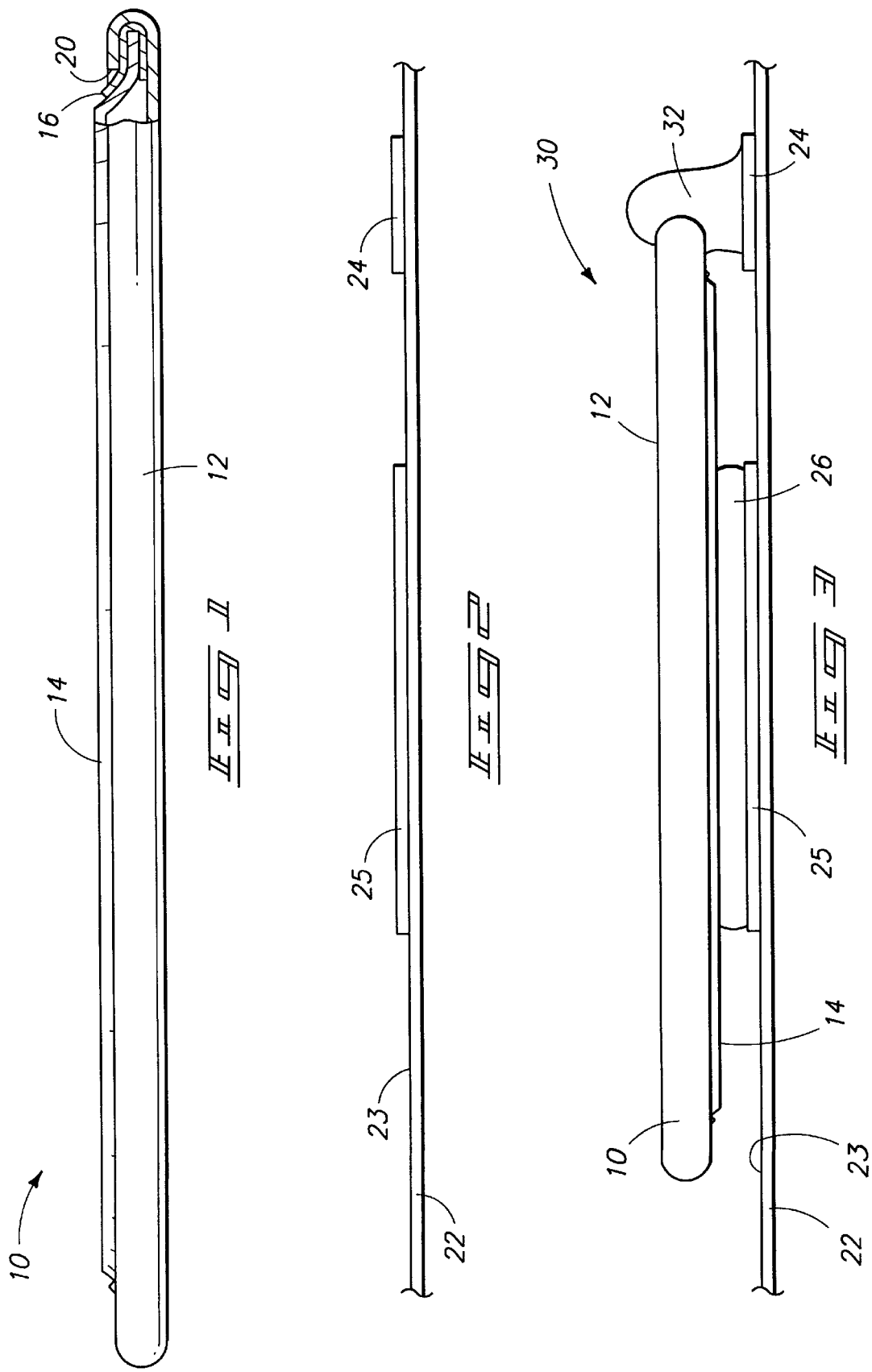

6,030,423

THIN PROFILE BATTERY BONDING METHOD AND METHOD OF CONDUCTIVELY INTERCONNECTING ELECTRONIC COMPONENTS

TECHNICAL FIELD

This invention relates to thin profile battery bonding methods, to methods of conductively interconnecting electronic components, to battery powerable apparatus, to radio frequency communication devices, and to electric circuits.

BACKGROUND OF THE INVENTION

Thin profile batteries comprise batteries that have thickness dimensions which are less than a maximum linear dimension of its anode or cathode. One type of thin profile battery is a button type battery. Such batteries, because of their compact size, permit electronic devices to be built which are very small or compact.

One mechanism by which thin profile batteries are electrically connected with other circuits or components is with electrically conductive adhesive, such as epoxy. Yet in some applications, a suitably conductive bond or interconnection is not created in spite of the highly conductive nature of the conductive epoxy, the outer battery surface, and the substrate surface to which the battery is being connected. This invention arose out of concerns associated with providing improved conductive adhesive interconnections between thin profile batteries and conductive nodes formed on substrate surfaces. The invention has other applicability as will be appreciated by the artisan, with the invention only being limited by the accompanying claims appropriately interpreted in accordance with the Doctrine of Equivalents.

SUMMARY OF THE INVENTION

The invention in one aspect includes a thin profile battery bonding method. In one implementation, a curable adhesive composition is provided which comprises an epoxy terminated silane. A thin profile battery and a substrate to which the thin profile battery is to be conductively connected are also provided. The curable adhesive composition is interposed between the thin profile battery and the substrate. It is cured into an electrically conductive bond electrically interconnecting the battery and the substrate.

The invention in another aspect includes a method of conductively interconnecting electronic components. In one implementation, a curable adhesive composition comprising an epoxy terminated silane is provided. First and second electronic components to be conductively connected with one another are provided. The curable adhesive composition is interposed between the first and second electronic components. The adhesive is cured into an electrically conductive bond electrically interconnecting the first and second components.

The invention in still another aspect includes interposing a curable epoxy composition between first and second electrically conductive components to be electrically interconnected. At least one of the components comprises a metal surface with which the curable epoxy is to electrically connect. The epoxy is cured into an electrically conductive bond electrically interconnecting the first and second components. The epoxy has an effective metal surface wetting concentration of silane to form a cured electrical interconnection having contact resistance through said metal surface of less than or equal to about 0.3 ohm-$cm^2$.

The invention in a further aspect includes a battery powerable apparatus. In one implementation, such includes a substrate having a surface comprising at least one node location. A thin profile battery is mounted over the substrate and node location. A conductive adhesive mass electrically interconnects the thin profile battery with the node location, with the conductive adhesive mass comprising an epoxy terminated silane.

The invention in still a further aspect includes a radio frequency communication device. In one implementation, such includes a substrate having conductive paths including an antenna. At least one integrated circuit chip is mounted to the substrate and in electrical connection with a first portion of the substrate conductive paths. A thin profile battery is conductively bonded with a second portion of the substrate conductive paths by a conductive adhesive mass, with the conductive adhesive mass comprising an epoxy terminated silane.

The invention in still another aspect includes an electric circuit comprising first and second electric components electrically connected with one another through a conductive adhesive mass comprising an epoxy terminated silane.

BRIEF DESCRIPTION OF THE DRAWINGS

Preferred embodiments of the invention are described below with reference to the following accompanying drawings.

FIG. 1 is a side elevational, partial cross sectional, view of a thin profile battery.

FIG. 2 is a side elevational view of a substrate.

FIG. 3 is a side elevational view of a battery powerable apparatus.

DETAILED DESCRIPTION OF THE PREFERRED EMBODIMENTS

Figure 4:
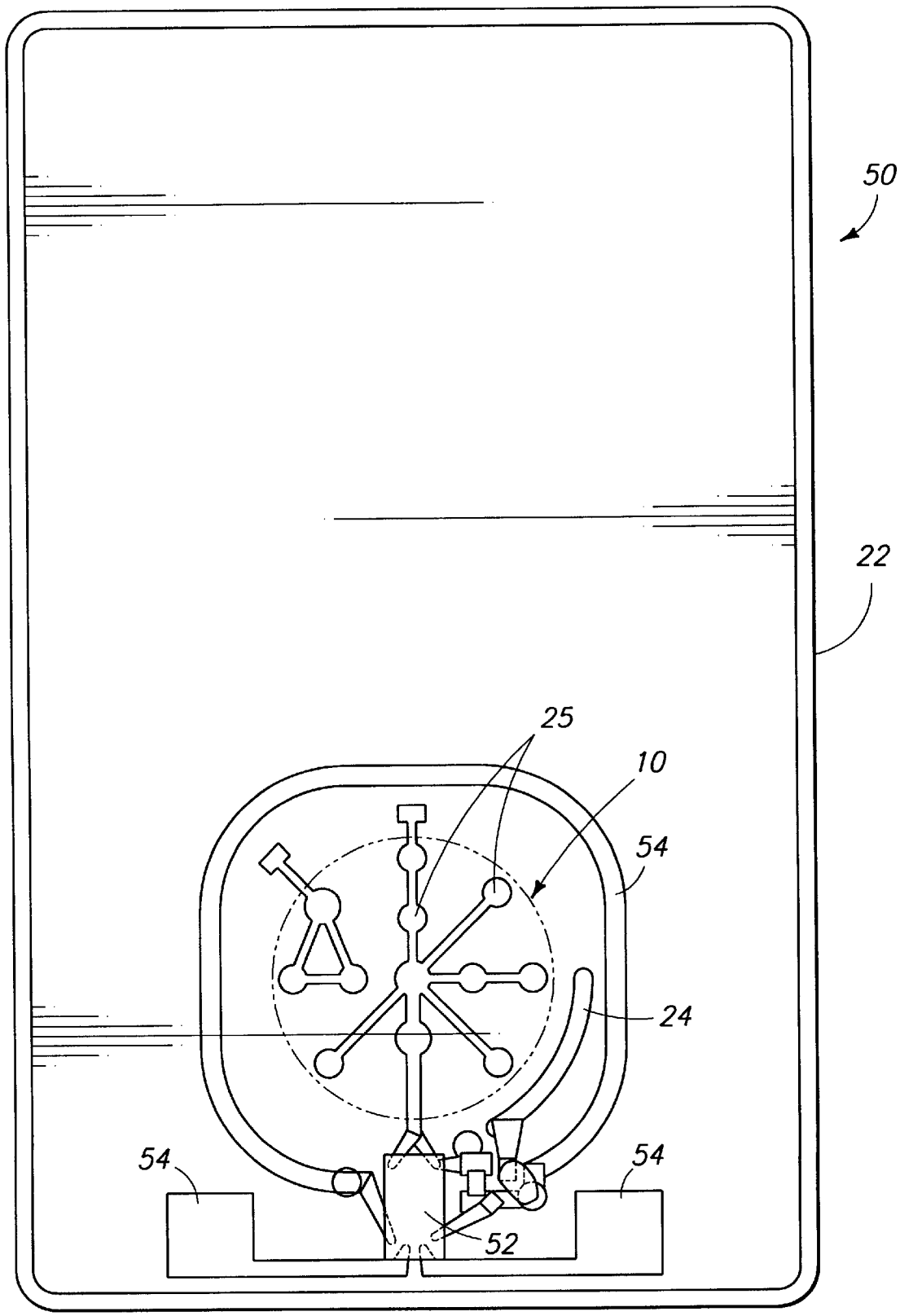
FIG. 4 is a diagrammatic plan view of a radio frequency communication device.

This disclosure of the invention is submitted in furtherance of the constitutional purposes of the U.S. Patent Laws "to promote the progress of science and useful arts" (Article 1, Section 8).

Referring to FIG. 1, a single thin-profile battery is indicated generally with reference numeral 10. In the context of this document, "thin-profile battery" is intended to define any battery having a thickness dimension which is less than a maximum linear dimension of its anode or cathode. The preferred and illustrated battery 10 comprises a circular button-type battery. Such comprises a lid terminal housing member 14 and a can terminal housing member 12. Can 12 is crimped about lid 14, having an insulative sealing gasket 16 interposed therebetween. In the illustrated example, gasket 16 projects outwardly slightly relative to the crimp as shown.

FIG. 2 illustrates a substrate 22 to which thin-profile battery 10 is to be conductively connected. Substrate 22 includes an outer surface 23 having one node location 24 and another node location 25 to which battery electrical connection is desired. Substrate 22, for example, can comprise a flexible circuit substrate, wherein nodes 24 and 25 comprise printed thick film ink formed on surface 23.

Referring to FIG. 3, a curable adhesive composition or mass 26 comprising an epoxy-terminated silane is interposed between lid 14 of thin profile battery 10 and substrate 22 over node location 25. Further, a curable adhesive composition or mass 32 comprising an epoxy-terminated silane is interposed between can 12 of thin-profile battery 10 and node location 24 on substrate 22. The preferred curable adhesive composition comprises a two-part epoxy resin and hardener system, wherein the preferred epoxy-terminated silane comprises a glycidoxy methoxy silane, such as a glycidoxyproplytrimethoxysilane, with 3-glycidoxyproplytrimethoxysilane being a specific example. The epoxy-terminated silane is preferably present in the curable adhesive composition at less than or equal to about 2% by weight, with less than or equal to about 1% by weight being even more preferred.

One example 3-glycidoxyproplytrimethoxysilane is available from Dow Corning Corporation of Midland, Michigan, as Z-6040™ Silane. An example resin and hardener system for a conductive epoxy is available from Creative Materials, Inc., of Tyngsboro, Mass., as Part Nos. CMI 116-37A™ and CMIB-187™, respectively. In a preferred example, from 0.5 to 2.0 weight parts of Z-6040™ silane is combined with 100 weight parts of the CMI 116-37A™ silver epoxy resin. A preferred concentration of the Z-6040™ is 1 weight part with 100 weight parts of epoxy resin. Such a solution is thoroughly mixed and combined with, for example, 3 weight parts of the CMIB-187™ hardener, with the resultant mixture being further suitably mixed to form composition 26.

The composition is applied to one or both of battery 10 or substrate 22, and provided as shown in FIG. 3. An example size for conductive mass 26 is a substantially circular dot having a diameter of about 0.080 inch (0.2032 cm) and a thickness of about 0.002 inch (0.00508 cm). Resistance of a fully cured mass 26 was measured with an ohmmeter from the top of the mass to the substrate surface, which comprised a nickel-clad stainless steel Eveready CR2016™ button-type battery can. Typical measured resistance where no epoxy-terminated silane or other additive was utilized ranged from 10 ohms to 100 ohms, with in some instances resistance being as high as 1000 ohms. These correspond to respective calculated contact resistances ranging from about 0.32 ohm-$cm^2$ to 3.24 ohms-$cm^2$, with as high as 32.43 ohms-$cm^2$, when ignoring the volume resistances of the epoxy mass and substrate. At the time of preparation of this document, 10 ohms (and its associated calculated contact resistance of 0.32 ohm-$cm^2$) is considered high and unacceptable for purposes and applications of the assignee, such as will be described with reference to FIG. 4. Yet where the epoxy-terminated silane was added, for example at a weight percent of 2% or less, the typical resistance value and range dropped significantly to 0.1 ohm to 1.0 ohm, with 0.2 ohm being typical. These correspond to respective contact resistances of about 0.0032 ohm-$cm^2$, 0.032 ohm-$cm^2$, and 0.0064 ohm-$cm^2$.

It is perceived that the prior art conductive bonding without the epoxy-terminated silane results from poor wetting characteristics of the conductive epoxy with the metal outer surface of the button-type battery, which typically comprises a nickel-clad stainless steel. The epoxy-terminated silane significantly improves the wetting characteristics relative to the metal surfaces, such as nickel-clad stainless steel, in a conductive epoxy system in a manner which is not understood to have been reported or known in the prior art. Accordingly in accordance with another aspect of the invention, a thin-profile battery bonding method interposes epoxy between a battery and substrate with at least one of such having a metal surface to which the curable epoxy is to electrically connect. The epoxy has an effective metal surface wetting concentration of silane to form a cured electrical interconnection having a contact resistance through said metal surface of less than or equal to about 0.30 ohm-$cm^2$. More preferred, the epoxy has an effective metal surface wetting concentration of silane to form a cured electrical interconnection have a contact resistance through said metal surface of less than or equal to about 0.16 ohm-$cm^2$. Most preferred, such concentration provides a contact resistance of less than or equal to about 0.032 ohm-$cm^2$.

The curable adhesive composition is then cured into an electrically conductive bond which electrically interconnects the battery and substrate as shown in FIG. 3. In the preferred embodiment, such electrically conductive bond also is the sole physical support and connection of the battery and its terminals relative to substrate 22.

Although the invention was reduced to practice utilizing formation of a conductive interconnection between a metal battery terminal and a printed thick film on a substrate, the invention has applicability in methods and constructions of producing an electric circuit comprising other first and second electric components which electrically connect with one another through a conductive adhesive mass comprising, in a preferred embodiment, an epoxy-terminated silane.

FIG. 3 depicts an exemplary battery powerable apparatus and electric circuit 30 in accordance with an aspect of the invention. In one preferred implementation, battery powerable apparatus 30 preferably comprises a radio frequency communication device 50 as exemplified in FIG. 4. In such example, substrate 22 preferably comprises a flexible circuit substrate, with nodes 25 and 24 constituting a portion of a series of conductive paths formed of printed thick film ink on surface 23 of flexible substrate 22. Such conductive paths includes antenna portions 54. At least one, and preferably only one, integrated circuit chip 52 is mounted relative to substrate 22 and in electrical connection with a first portion of the substrate conductive paths. Mounting is preferably with electrically conductive epoxy such as described above. Adhesive mass 26 electrically connects lid 14 of thin profile battery 10 with a second portion of the substrate conductive paths. In this example, such second portion comprises a series of printed thick film nodes 25. Conductive adhesive mass 32 electrically connects with a third portion of the substrate conductive paths, which in this example comprises node 24 in the shape of an arc.

An exemplary single integrated circuit chip is described in U.S. patent application Ser. No. 08/705,043, which names James O'Toole, John R. Tuttle, Mark E. Tuttle, Tyler Lowery, Kevin Devereaux, George Pax, Brian Higgins, Shu-Sun Yu, David Ovard, and Robert Rotzoll as inventors, which was filed on Aug. 29, 1996, and is assigned to the assignee of this patent application. The entire assembly 50 preferably is encapsulated in and comprises an insulative epoxy encapsulant material. Although this disclosure shows a single battery 10 mounted to substrate 22 for clarity and ease of description, multiple button type batteries stacked in series are preferably utilized as is collectively disclosed in the incorporated disclosures.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A thin profile battery bonding method comprising:
    providing a conductively curable adhesive composition comprising an epoxy terminated silane;
    providing a thin profile battery and a substrate to which the thin profile battery is to be conductively connected;
    interposing the conductively curable adhesive composition between the thin profile battery and the substrate; and
    curing the adhesive into an electrically conductive bond which electrically interconnects the battery and the substrate.

2. The method of claim 1 wherein the epoxy terminated silane comprises a glycidoxy methoxy silane.

3. The method of claim 1 wherein the epoxy terminated silane comprises a glycidoxyproplytrimethoxysilane.

4. The method of claim 1 wherein the epoxy terminated silane is present in the curable adhesive composition at less than or equal to about 2% by weight.

5. The method of claim 1 wherein the epoxy terminated silane is present in the curable adhesive composition at less than or equal to about 1% by weight.

6. The method of claim 1 wherein the thin profile battery comprises an outer nickel clad stainless steel surface over which the curable adhesive composition is received.

7. The method of claim 1 wherein the thin profile battery is a button type battery having a terminal housing member comprising an outer nickel clad stainless steel surface over which the curable adhesive composition is received.

8. The method of claim 1 wherein the thin profile battery is a button type battery having a terminal housing member comprising an outer nickel clad stainless steel surface over which the curable adhesive composition is received, and the substrate comprises conductive printed thick film ink over which the curable adhesive composition is received.

9. A thin profile battery bonding method comprising:
    interposing a curable epoxy composition between a thin profile battery and a substrate to which the thin profile battery is to be conductively connected, at least one of the battery and substrate comprising a metal surface with which the curable epoxy is to electrically connect; and
    curing the epoxy into an electrically conductive bond electrically interconnecting the battery and the substrate, the epoxy having an effective metal surface wetting concentration of silane to form a cured electrical interconnection having a contact resistance through said metal surface of less than or equal to about 0.3 ohm-cm$^2$.

10. The method of claim 9 wherein the epoxy has an effective metal surface wetting concentration of silane to form a cured electrical interconnection having a resistance through said metal surface of less than or equal to about 0.16 ohm-cm$^2$.

11. The method of claim 9 wherein the epoxy has an effective metal surface wetting concentration of silane to form a cured electrical interconnection having a resistance through said metal surface of less than or equal to about 0.032 ohm-cm$^2$.

12. The method of claim 9 wherein the metal surface wetting concentration of silane in the curable adhesive composition is less than or equal to about 2% by weight.

13. The method of claim 9 wherein the metal surface wetting concentration of silane in the curable adhesive composition is less than or equal to about 1% by weight.

14. The method of claim 9 wherein the thin profile battery has the metal surface and which comprises nickel clad stainless steel over which the curable adhesive composition is received.

15. The method of claim 9 wherein the thin profile battery has the metal surface and is a button type battery having a terminal housing member comprising nickel clad stainless steel over which the curable adhesive composition is received.

16. The method of claim 9 wherein the epoxy terminated silane comprises a glycidoxy methoxy silane.

* * * * *

UNITED STATES PATENT AND TRADEMARK OFFICE
CERTIFICATE OF CORRECTION

PATENT NO. : 6,030,423
DATED : February 29, 2000
INVENTOR(S) : Rickie C. Lake

It is certified that error appears in the above-identified patent and that said Letters Patent is hereby corrected as shown below:

Add the following to the end of the Abstract:
-- In another aspect, a battery powerable apparatus includes a conductive adhesive mass comprising an epoxy terminated silane between battery and substrate. A radio frequency communication device is one example. In another aspect, the second electric conponents electrically connected with one another through a conductive adhesive mass comprising an epoxy terminated silane. --

Column 4,
Lines 53-57, delete starting at "Although" and ending at "disclosures."

Signed and Sealed this

Twenty-first Day of August, 2001

Attest:

NICHOLAS P. GODICI
*Attesting Officer*   *Acting Director of the United States Patent and Trademark Office*